US009557372B2

(12) United States Patent
De La Puente et al.

(10) Patent No.: US 9,557,372 B2
(45) Date of Patent: Jan. 31, 2017

(54) TESTER HAVING AN APPLICATION SPECIFIC ELECTRONICS MODULE, AND SYSTEMS AND METHODS THAT INCORPORATE OR USE THE SAME

(75) Inventors: Edmundo De La Puente, Cupertino, CA (US); Ken Hanh Duc Lai, Sunnyvale, CA (US)

(73) Assignee: ADVANTEST CORPORATION, Tokyo (JP)

( * ) Notice: Subject to any disclaimer, the term of this patent is extended or adjusted under 35 U.S.C. 154(b) by 493 days.

(21) Appl. No.: 13/882,477

(22) PCT Filed: Oct. 29, 2010

(86) PCT No.: PCT/US2010/054835
§ 371 (c)(1),
(2), (4) Date: Feb. 5, 2014

(87) PCT Pub. No.: WO2012/057799
PCT Pub. Date: May 3, 2012

(65) Prior Publication Data
US 2014/0139251 A1    May 22, 2014

(51) Int. Cl.
*G01R 31/28*    (2006.01)
*G01R 1/04*    (2006.01)

(52) U.S. Cl.
CPC ......... *G01R 31/2889* (2013.01); *G01R 1/0408* (2013.01); *G01R 31/2834* (2013.01)

(58) Field of Classification Search
None
See application file for complete search history.

(56) References Cited

U.S. PATENT DOCUMENTS 6,456,099 B1 *  9/2002  Eldridge ............ G01R 1/07307
257/E23.079

* cited by examiner

*Primary Examiner* — Paresh Patel

(57) ABSTRACT

In one embodiment, an automated test equipment (ATE) system includes a tester having a tester electronics module, an application specific electronics module, and a tester-to-device under test (DUT) interface mount. The tester electronics module has a first electronics interface configured to electrically connect to a tester-to-DUT interface when the tester-to-DUT interface is coupled to the tester-to-DUT interface mount. The application specific electronics module has a second electronics interface and a third electronics interface. The second and third electronics interfaces are configured to electrically connect to the tester-to-DUT interface when the tester-to-DUT interface is coupled to the tester-to-DUT interface mount. The application specific electronics module is configured to communicate with the tester electronics module via the second electronics interface, and with at least one DUT via the third electronics interface.

18 Claims, 9 Drawing Sheets

TESTER HAVING AN APPLICATION SPECIFIC ELECTRONICS MODULE, AND SYSTEMS AND METHODS THAT INCORPORATE OR USE THE SAME

BACKGROUND

When testing electronic devices, it is often desirable to transmit a large number of signals between the electronics of a test system and one or more devices under test (DUTs). It is also typically desirable for a test system to provide a wide range of functionality for testing DUTs.

Semiconductor test (and particularly, semiconductor wafer test or "wafer sort") is an application where it can be especially useful for a test system to provide both a high signal count and wide range of test functionality to a plurality of DUTs (i.e., to a plurality of DUTs on a semiconductor wafer). A high signal count and wide range of functionality can also be useful in semiconductor "final test", and in other applications.

It is also desirable that test systems, and particularly automated test equipment (ATE) systems used for semiconductor test, provide a wide range of test functionality so that, over their life cycles, the systems can be used to test different types of DUTs (e.g., DUTs having different physical configurations, and DUTs having different functionality).

SUMMARY

Disclosed herein is an automated test equipment (ATE) system that includes a tester having: a tester electronics module, an application specific electronics module, and a tester-to-device under test (DUT) interface mount. The tester electronics module has a first electronics interface configured to electrically connect to a tester-to-DUT interface when the tester-to-DUT interface is coupled to the tester-to-DUT interface mount. The application specific electronics module has a second electronics interface and a third electronics interface. The second and third electronics interfaces are configured to electrically connect to the tester-to-DUT interface when the tester-to-DUT interface is coupled to the tester-to-DUT interface mount. The application specific electronics module is configured to communicate with the tester electronics module via the second electronics interface, and with at least one DUT via the third electronics interface.

Also disclosed is an ATE system that includes a tester having: a plurality of electronics module mounts; a tester electronics module mounted to one of the electronics module mounts; and an application specific electronics module mounted to one of the electronics module mounts. The ATE system also includes a detachable tester-to-DUT interface which is electrically and detachably connectable to the tester. The tester-to-DUT interface has a DUT interface, and the DUT interface is electrically and detachably connectable to a DUT. The ATE system further has 1) an ATE signal path between the tester electronics module and the application specific electronics module, and 2) a DUT signal path between the application specific electronics module and the DUT interface. The ATE signal path is defined in part by the detachable tester-to-DUT interface. The DUT signal path is also defined in part by the detachable tester-to-DUT interface. Detachment of the detachable tester-to-DUT interface from the tester breaks both the ATE signal path and the DUT signal path.

A method of testing a DUT is also disclosed. The method comprises 1) providing a tester having a tester electronics module and an application specific electronics module, and 2) electrically connecting a tester-to-DUT interface to both the tester electronics module and the application specific electronics module. The connection of the tester-to-DUT interface to both the tester electronics module and application specific electronics module completes a signal path between the tester electronics module and the application specific electronics module. The method further comprises programming the tester to transmit a first signal along the signal path, from the tester electronics module, through the tester-to-DUT interface, to the application specific electronics module. The first signal causes the application specific electronics module to transmit a second signal from the application specific electronics module, through the tester-to-DUT interface, to the DUT.

Other systems and methods, including variations and additions to the above-described systems and methods, are also disclosed.

BRIEF DESCRIPTION OF THE DRAWINGS

Illustrative embodiments of the invention are illustrated in the drawings, in which.

DETAILED DESCRIPTION

Figure 1:
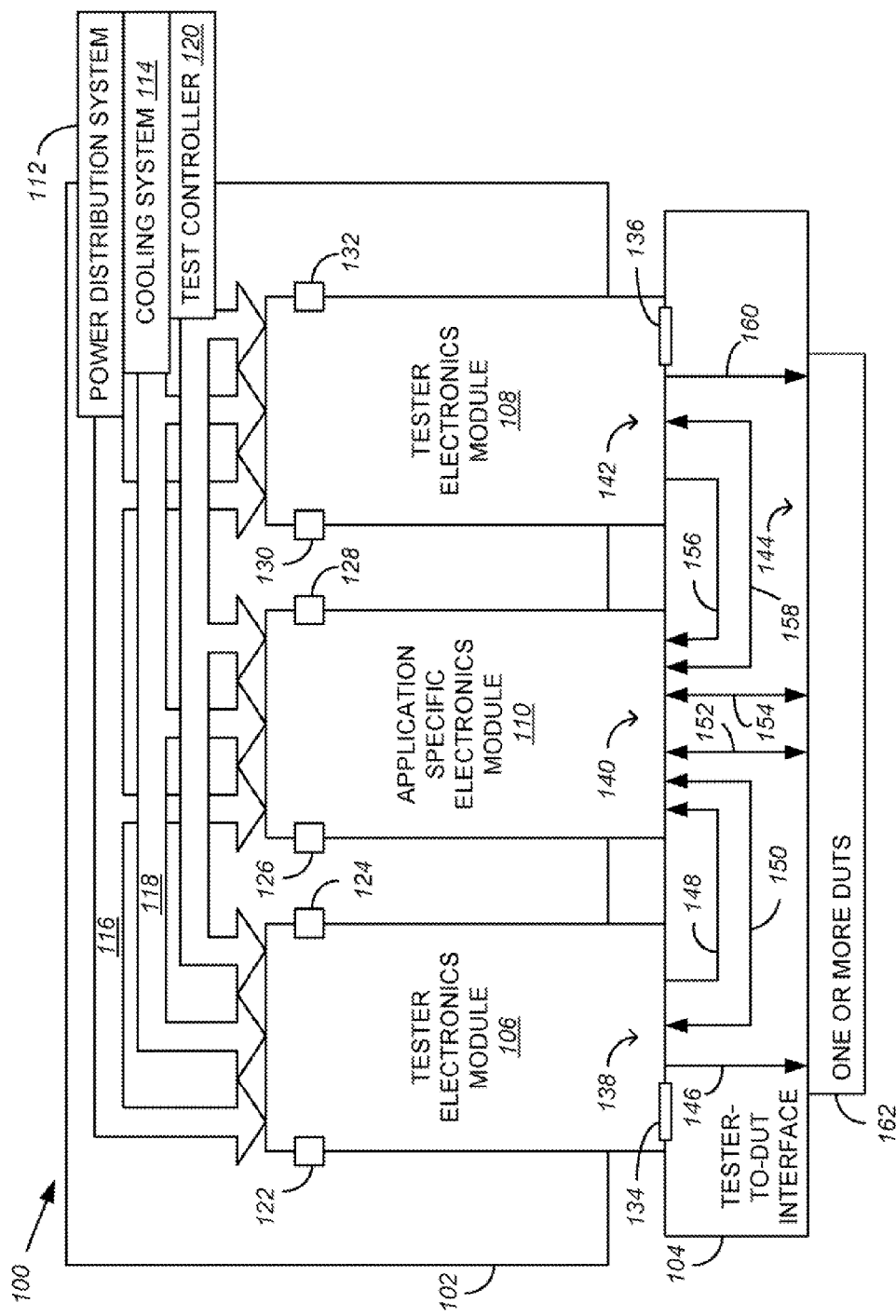
FIG. 1 illustrates an exemplary ATE system having a tester and a tester-to-DUT interface.

Integrated circuit manufacturers sometimes employ methods known as Build Off Self Test (BOST) to extend the capabilities of an automated test equipment (ATE) system. BOST is a technique by which circuitry and any necessary support hardware is added to an ATE system's probe card or load board. The added circuitry can serve various purposes, and can provide, for example, 1) circuitry such as switches or multiplexers, which circuitry increases test parallelism by enabling the sharing of tester resources, or 2) circuitry that provides functionality not already present in an ATE system.

From an electrical or logical viewpoint, BOST circuitry is typically placed between an ATE system and one or more devices under test (DUTs). In the case of probe cards, the added circuitry may be implemented directly on a probe card (e.g., as part of the probe card, or mounted directly to the probe card). Alternately, the added circuitry may be implemented on one or more printed circuit boards (PCBs) or cards that are coupled to the probe card. These additional PCBs or cards are often referred to as daughter boards, and are mechanically and electrically coupled to a probe card using, for example, ball grid arrays or edge connectors. The daughter boards are in some cases oriented perpendicular to the plane of the probe card, and in other cases are oriented parallel to the plane of the probe card (e.g., in a mezzanine configuration). Using the daughter board approach, more circuitry can typically be added to an ATE system as compared to implementing circuitry directly on a probe card.

Regardless of how BOST is implemented, its circuitry is typically used to intercept control or data signals generated by an ATE system or number of DUTs. In the case of an intercepted ATE signal, BOST circuitry may, for example: condition, transform or amplify the ATE signal; fan-out the ATE signal to increase test parallelism; or perform a test or action in response to the ATE signal. In the case of an intercepted DUT signal, BOST circuitry may, for example: condition, transform or amplify the DUT signal; temporarily store the DUT signal; combine the DUT signal with other DUT signals for the purpose of increasing test parallelism; or monitor a DUT signal for a particular condition, which condition may simply be identified, or which condition may be used to trigger a function. In any case, BOST circuitry typically increases test parallelism or expands tester functionality.

An ATE system typically communicates with (and controls) BOST circuitry by sending and receiving signals to/from the BOST circuitry over normal ATE system test channels. The signals are sent or received under software control, and in some cases may be sent or received under control of a test program. In many cases, the test program executes automatically, with little or no need for user input. In other cases, an ATE system operator or test engineer may cause specific instructions or instruction sets to be executed, such as, for example, by interacting with ATE software in a diagnostic or engineering mode.

As demands for increased test parallelism and functionality continue, so too have the demands for greater quantities and densities of BOST circuitry increased. These demands have pushed the applied technology in BOST circuitry and its supporting hardware to the point where it is not likely to be sustainable long term. In order to increase the quantity and density of BOST circuitry that can be added to a probe card or load board, BOST developers have been moving toward higher levels of integration. However, this higher level of integration has led to partly or fully customized hardware (e.g., probe cards and BOST circuitry), which hardware is typically produced in small volumes and at relatively greater expense (and sometimes significant expense). Yet, even with custom hardware, it is becoming more apparent that there is not enough room on probe cards or load boards to add the quantity, size or density of circuits that are needed to satisfy the desire for increased test parallelism and functionality. One exemplary application that is pushing the limits of BOST is single touchdown testing of a semiconductor wafer in wafer sort applications.

Another issue with BOST circuitry is cost. The cost of BOST is attributable not only to the quantity and complexity of BOST circuitry, but to the afore-mentioned levels of customization and integration. For example, customization and integration have made BOST circuitry a consumable item that is 1) specifically designed for each new probe card or load board, and 2) added to the expense of each probe card or load board purchase.

Yet another issue with BOST circuitry is reliability. In some applications, BOST circuitry entails thousands of components, which components are subjected to frequent handling as probe cards or load boards are loaded and unloaded on a tester. BOST circuitry is also typically subjected to physical conditions such as high heat and heating/cooling cycles (e.g., high heat resulting from "at temperature" testing of many DUTs, or heating/cooling cycles to which DUTs are subjected during test). In some cases, the handling of a probe card or load board, or the physical conditions to which it is exposed, may lead to obvious physical damage to BOST circuitry. In other cases, the handling or physical conditions may lead to damage that is more difficult to detect, such as electrostatic discharge (ESD) damage or weakened solder joints. Regardless, damage to BOST circuitry can be costly in many ways, due to costs associated with the diagnosis and repair of the BOST circuitry, and due to downtime of a test system or manufacturing line that lies dormant while the BOST circuitry is repaired.

Given some of the above-described issues with BOST, a tester having one or more application specific electronics modules is described below. Systems and methods that incorporate or use such a tester are also disclosed. An application specific electronics module can provide various types of circuitry and functionality, including circuitry and functionality that might have previously been provided as BOST circuitry, such as switches for increasing the parallelism of a test system. However, in contrast to BOST circuitry, which is integrated with (or coupled to) a probe card or load board, the application specific electronics modules described below are mounted to (and removed from) a tester independently of a probe card or load board. In this manner, there is less handling of the application specific electronics modules, and their reliability and damage avoidance can typically be improved. The application specific electronics modules can also be better positioned to take advantage of power, cooling and other interfaces of the tester to which they are mounted.

Similar to BOST circuitry, an application specific electronics module is coupled to at least some of a tester's other circuitry, and to one or more DUTs, via a tester-to-DUT interface (e.g., a probe card or load board). However, in the case of an application specific electronics module, installation or removal (i.e., detachment) of a tester-to-DUT interface on/from a tester only makes or breaks signal paths between the application specific electronics module and the tester, and does not physically add or remove the application specific electronics module to/from the tester.

FIG. 1 illustrates an exemplary ATE system 100 comprising a tester 102 and a tester-to-DUT interface 104. The tester 102 is shown to comprise a plurality of electronics modules 106, 108, 110. By way of example, the electronics modules 106, 108, 110 are shown to comprise first and second tester electronics modules 106, 108 and an application specific electronics module 110. The number of each types of electronics modules can vary, and alternate embodiments of the ATE system 100 may include from one to many of each type of electronics module 106, 110.

The ATE system 100 may comprise one or more systems that support or enable the electronics modules 106, 108, 110.

By way of example, the ATE system 100 is shown to comprise a power distribution system 112 and a cooling system 114, parts of which may be implemented external to the tester 102.

The cooling system 114 is in cooling communication with one or more, and in some cases all, of the electronics modules 106, 108, 110, as indicated by the cooling communication path 118. In some embodiments, and by way of example, the cooling system 114 may be a liquid cooling system, such as a water cooling system, and one or more of the electronics modules 106, 108, 110 may comprise a liquid conduit that fixedly or detachably couples to the liquid cooling system. In other embodiments, the cooling system 114 may be an air cooling system, and one or more of the electronics modules 106, 108, 110 may be mounted in an air flow path that is provided or generated by the air cooling system.

The power distribution system 112 is in power communication with one or more, and in some cases all, of the electronics modules 106, 108, 110, as indicated by the power distribution path 116. In some embodiments, the power distribution system 112 may comprise a power distribution circuit (i.e., part of power distribution system 112) that is coupled to the application specific electronics module 110 independently of the detachable tester-to-DUT interface 104, as illustrated by the power distribution path 116. In the same or other embodiments, the power distribution circuit may be coupled to the application specific electronics module 110 via one or more of the tester electronics modules 106, 108 and the tester-to-DUT interface 104.

In some cases, parts of the power distribution and cooling systems 112, 114 may be provided apart from the tester 102, and may be coupled to the tester 102.

The ATE system 100 may also comprise a test controller 120. The test controller 120 may be provided as part of the tester 102, as a system or component that is coupled to the tester 102 (e.g., in the form of an external test controller), or as a system or component having structures and functions that are distributed between the tester 102 and external systems or devices. The test controller 120 may comprise a processing system (e.g., a computer) that executes software including, for example, a test program. The software, and particularly the test program, determines what data and control signals are sent and received to/from the tester electronics modules 106, 108, and in some cases may configure other components and systems of the tester 102.

Each of the electronics modules 106, 108, 110 is mounted to the tester 102 with the aid of one or more electronics module mounts 122, 124, 126, 128, 130, 132. By way of example, each of the electronics module mounts 122, 124, 126, 128, 130, 132 may take the form of a connector, a clip, a nut and bolt assembly, a pin, a slot, or a track. Electronics module mounts 122, 124, 126, 128, 130, 132 may be provided by, or coupled to, a housing or chassis of the tester 102; or, electronics module mounts 122, 124, 126, 128, 130, 132 may be provided on other systems of the tester 102. If an electronics module mount takes the form of a connector, the connector may be, for example, an electrical connector or a cooling system connector. Each of the electronics module mounts 122, 124, 126, 128, 130, 132 may be dedicated for the mounting of a particular electronics module 106, 108 or 110 to the tester 102, or may be shared by multiple electronics modules. Each of the electronics modules 106, 108, 110 may be mounted to the tester 102 using one or more of the electronics module mounts 122, 124, 126, 128, 130, 132.

In some cases, different types of electronics module mounts may be used to mount different electronics modules 106, 108, 110 to the tester 102. In other cases, the same (identical) type of electronics module mount may be used to mount all electronics modules 106, 108, 110 to the tester 102 (including, for example, different types of electronics modules).

The tester-to-DUT interface 104 may be mechanically coupled to the tester 102 via one or more tester-to-DUT interface mounts 134, 136. By way of example, each of the tester-to-DUT interface mounts 134, 136 may take the form of a hook, pin, latch or connector that grasps a corresponding feature of the tester-to-DUT interface 104 and secures (or clamps) the tester-to-DUT interface 104 to the tester 102. The tester-to-DUT interface mounts 134, 136 may in some cases be provided by the tester electronics modules 106, 108 (as shown) or on the tester 102 (not shown).

The tester-to-DUT interface 104 may comprise one or more PCBs or other substrates that provide a tester interface 138, 140, 142 on one surface and a DUT interface 144 on an opposing surface. By way of example, the tester interface 138, 140, 142 may comprise an array of electrical contacts, connectors or probes that are configured to mate with corresponding electrical contacts, connectors or probes of the electronics modules 106, 108, 110. By way of further example, the DUT interface 144 may comprise an array of electrical contacts, connectors or probes that are configured to mate with corresponding electrical contacts, connectors or probes of one or more DUTs 162.

In cases where the tester-to-DUT interface 104 takes the form of a probe card, a plurality of semiconductor die on a semiconductor wafer or die carrier may be electrically and detachably connected to the probe card in parallel (i.e., as part of one connection process), for testing of some or all of the die in parallel. In cases where the tester-to-DUT interface 104 takes the form of a load board, a plurality of individual semiconductor devices may be electrically and detachably connected to the load board, for test of some or all of the die in parallel. Typically, a tester-to-DUT interface 104 provides thousands of connections between a tester 102 and one or more DUTs 162.

The tester interface 138, 140, 142 of the tester-to-DUT interface 104 may be electrically connected to the tester 102 as part of the process of mechanically mounting the tester-to-DUT interface 104 to the tester 104. Alternately, the tester interface 138, 140, 142 of the tester-to-DUT interface 104 may be electrically connected to the tester 102 as part of a later-performed process. In either case, electrical connection of the tester-to-DUT interface 104 to the tester 102 completes signal paths between ones of the electronics modules 106, 108, 110 and the DUTs 162 (referred to herein as DUT signal paths 146, 152, 154, 160), and between ones of the electronics modules 106, 108, 110 (referred to herein as ATE signal paths 148, 150, 156, 158).

As shown in FIG. 1, each of the ATE signal paths 148, 150, 156, 158 extends between a tester electronics module 106, 108 and an application specific electronics module 110, and is defined in part by the detachable tester-to-DUT interface 104. ATE signal paths 148, 150, 156, 158 may take the form of power signal paths (including ground signal paths), control signal paths, or data signal paths. Control signal paths may be used to provide control signals and instructions to an application specific electronics module 110. Data signal paths may be used to provide or receive data to/from the application specific electronics module 110.

Each of the DUT signal paths 146, 152, 154, 160 extends between a tester or application specific electronics module 106, 108, 110 and the DUT interface 144, and enables power, control or data signals to be transmitted between a tester or application specific electronics module 106, 108, 110 and the DUT interface 144.

Figure 2:
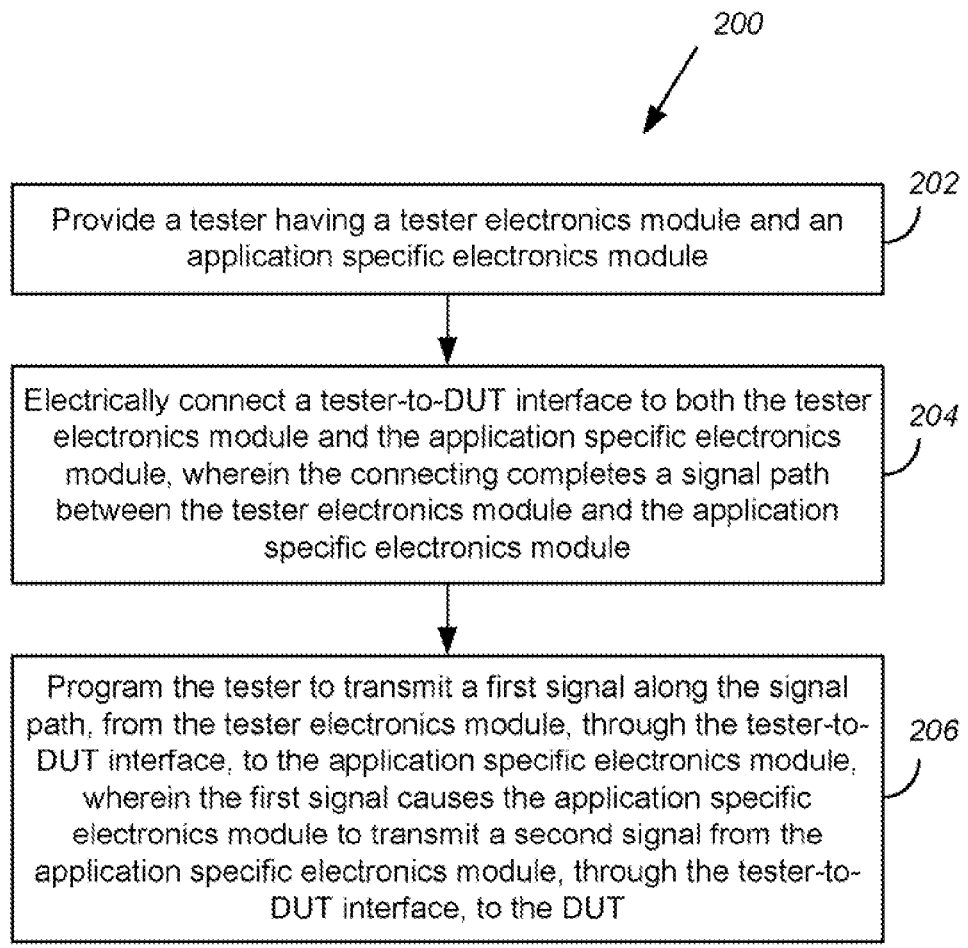
FIG. 2 illustrates an exemplary method of testing a DUT using a system such as the ATE system shown in FIG. 1.

FIG. 2 illustrates an exemplary method 200 of testing a DUT using a system such as the ATE system 100 shown in FIG. 1. The method 200 comprises providing a tester 102 having a tester electronics module 106 (see FIG. 1) and an application specific electronics module 110 (at block 202). In some cases, the step of providing the tester 102 may include mounting the tester electronics module 106 and the application specific electronics module 110 to respective circuit module mounts 122, 124, 126, 128 of the tester 102.

A tester-to-DUT interface 104 is electrically connected to both the tester electronics module 106 and the application specific electronics module 110 at block 204. The connecting completes a signal path 150 between the tester electronics module 106 and the application specific electronics module 110. At block 206, the tester 102 is programmed to transmit a signal (e.g., a first signal) from the tester electronics module 106, through the tester-to-DUT interface 104, to the application specific electronics module 110. The programming may be provided, for example, by software, firmware or hardware, which software, firmware or hardware may be located on (or executed by) the tester electronics module 106 or another tester component (e.g., a test controller 120). The first signal causes the application specific electronics module 110 to transmit a signal (e.g., a second signal) along a signal path 152 from the application specific electronics module 110, through the tester-to-DUT interface 104, to the DUT (at block 208). The first signal may also cause the application specific electronics module 110 to transmit a signal to multiple DUTs 162, or cause the application specific electronics module 110 to execute a test program, or cause the application specific electronics module 110 to transmit a series of signals to one or more DUTs 162. In this regard, it is also noted that not every signal transmitted from the application specific electronics module 110 needs to be triggered by a signal received from the tester electronics module 106. That is, the application specific electronics module 110 may be configured to transmit one or more signals automatically, upon power-up, or in response to signals received from one or more DUTs 162.

Although the method 200 has been described in terms of a single tester electronics module 106 and a single application specific electronics module 110, it will be apparent to those of ordinary skill in the art that the method 200 can be carried out in a test environment comprising any number of tester and application specific electronics modules. It is also noted that the signals transmitted by the method 200 may be, for example, signals that are transmitted in isolation or signals that are transmitted as part of a parallel signal transmission.

In some embodiments of the method 200, the tester 102 may be programmed to 1) transmit one or more signals from the tester electronics module 106, through the tester-to-DUT interface 104, to the application specific electronics module 110, and 2) transmit one or more other signals (e.g., a third signal) from the tester electronics module 106, through the tester-to-DUT interface 104, to the DUT. In other words, some of the signals transmitted from a tester electronics module 106 may be transmitted to an application specific electronics module, and other signals may not be routed to an application specific electronics module. How and where any particular signal is transmitted is determined, in large part, by the test program running on the test controller 120, and by the design of the tester-to-DUT interface 104 (which design can be different for different tester-to-DUT interfaces and DUTs). When the method 200 is carried out in the context of a tester 102 having multiple tester electronics modules 106, 108, the signals transmitted from any particular tester electronics module 106 or 108 may be transmitted to one or more application specific electronics modules, to one or more DUTs, or to a combination thereof.

The steps of the method 200 may also be supplemented to provide for data flow in the opposite direction—i.e., from one or more DUTs 162 to the application specific electronics module 110 or tester electronics module 106. For example, upon receiving one or more signals from one or more DUTs 162, the application specific electronics module 110 may transmit the signal(s) to the tester-to-DUT interface 104, and thereby to the tester electronics module 106. The application specific electronics module 110 may transmit the signal(s) automatically, at a time (or event) determined by the application specific electronics module 110; or, the application specific electronics module 110 may store the signal(s), and then transmit them to the tester electronics module 106 in response to an instruction or request issued by the tester electronics module 106. In the latter case, and by way of example, the tester 102 may be programmed to transmit a signal (e.g., a third signal) from the tester electronics module 106, through the tester-to-DUT interface 104, to the application specific electronics module 110. When the third signal is received by the application specific electronics module 110, it causes the application specific electronics module 110 to transmit a signal (e.g., a fourth signal) from the application specific electronics module 110, through the tester-to-DUT interface 104, to the tester electronics module 106.

In some cases, the application specific electronics module 110 may simply forward signals received from one or more DUTs 162 to the tester-to-DUT interface 104, and thereby to the tester electronics module 106. In other cases, the application specific electronics module 110 may process the signals it receives from one or more DUTs 162, and then transmit the processed signals to the tester-to-DUT interface 104 (and thereby, to the tester electronics module 106). Processed signals may comprise, for example, signals indicative of the collective pass/fail evaluation of a plurality of signals, or signals indicating the outcome of a comparison performed by the application specific electronics module 110.

As previously mentioned, the mounting of one or more application specific electronics modules to a tester, independently of a probe card or load board that is mounted to the tester, can reduce the likelihood of damaging the modules and increase their reliability over daughter boards and BOST hardware mounted to (and moved with) a probe card or load board. In addition, the mounting of one or more application specific electronics modules to a tester allows the module(s) to better capitalize on power, cooling, ESD protection and other systems of the tester. The use of application specific electronics modules as shown and described herein also frees space on a probe card or load board for other components and functionality, such as a higher density of DUT probes.

The mounting of an application specific electronics module to a tester, independently of a probe card or load board, also enables the application specific electronics module to be reused with different probe cards, load boards, or DUTs. This potential increased versatility and reusability of the application specific electronics module may justify an investment in additional design or manufacturing costs in the application specific electronics module, because the cost can be amortized over more uses or applications. This additional investment may be used, for example, to provide the application specific electronics module with improved reliability, better performance, or greater functionality.

Although the tester electronics modules and application specific electronics modules are mounted to a tester independently of any tester-to-DUT interface (e.g., a probe card or load board), the electronics modules do need to be mounted to the tester. In some instances, this may be done prior to the sale or installation of the tester at a customer site, or by a technician of the tester's vendor. In other instances, one or more of the electronics modules may be mounted to the tester by the customer. For example, in some cases, it is envisioned that a customer will specify a custom configuration of a tester, and a vendor will preinstall a number of tester electronics modules and application specific electronics modules in a tester before delivering the tester to the customer. In other cases, and by way of further example, a tester may be provided to a customer with a number of tester electronics modules installed therein, and the customer may then install application specific electronics modules in one or more expansion bays (or slots) of the tester. The expansion bays may be provided at various locations relative to a tester-to-DUT interface, such that the lengths of ATE and DUT signal paths may be minimized. Alternately, the expansion bay(s) may be centralized and provided, for example, at a central location relative to the tester-to-DUT interface. In some cases, the expansion bay(s) may be reserved solely for application specific electronics modules. In other cases, the expansion bay(s) may be configured to receive either tester electronics modules or application specific electronics modules. Still further, a tester may be provided with one or more tester electronics modules that are removable and replaceable with application specific electronics modules.

FIGS. 3-10 illustrate various views and components of an exemplary ATE system 300 configured for wafer sort. The ATE system 300 utilizes a combination of both tester electronics modules 302 and application specific electronics modules 304. By way of example, the tester electronics modules 302 and application specific electronics modules 304 are placed on boards (e.g., printed circuit board (PCBs)) that are oriented at right angles to a plane of a DUT or DUTs 306. In this regard, an exemplary orientation of tester electronics modules 302, application specific electronics modules 304, and semiconductor wafer 306 is shown, generally, in FIGS. 3 & 4.

Figure 3:
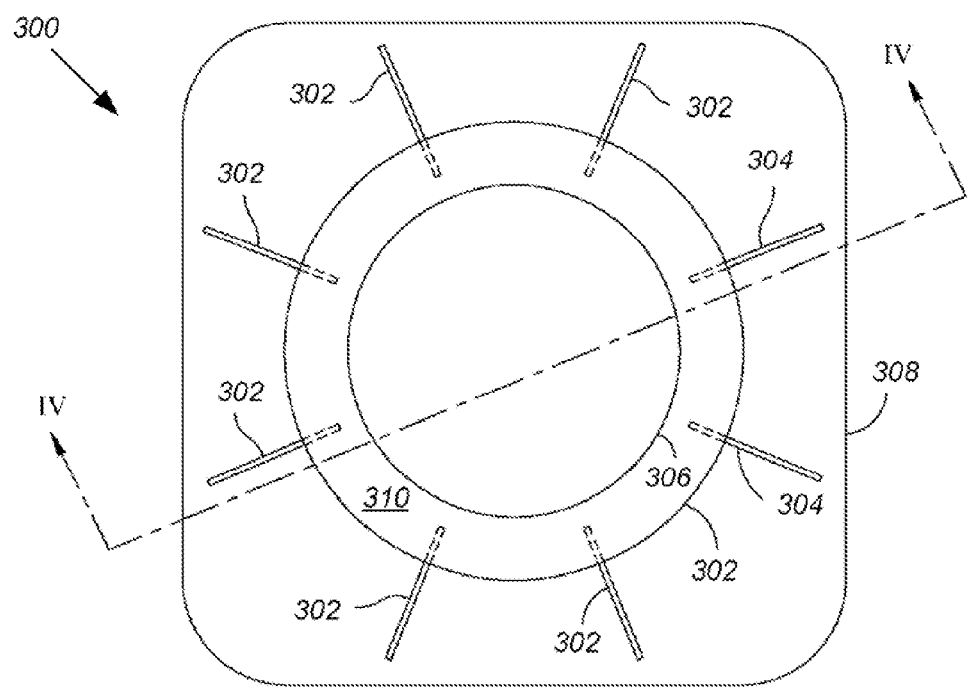
FIG. 3 illustrates a plan view of an exemplary ATE system.
Figure 4:
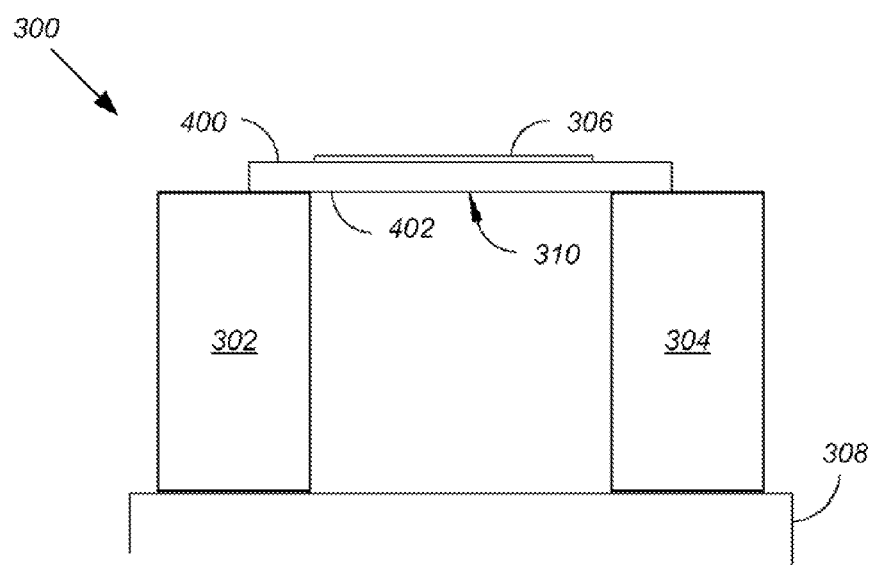
FIG. 4 illustrates a cross-sectional elevation of the tester, probe card, wafer, tester electronics module, and application specific electronics module shown in FIG. 3.

By way of example, FIG. 3 illustrates a plan view of the ATE system 300. The ATE system 300 includes a tester 308, a probe card 310, a semiconductor wafer 306 (i.e., a "wafer"), a plurality of tester electronics modules 302, and a plurality of application specific electronics modules 304. The tester electronics modules 302 and application specific electronics modules 304 are mounted to the tester 308 via electronic module mounts (not shown in FIGS. 3 & 4). The probe card 310 is electrically coupled to the tester electronics modules 302 and application specific electronics modules 304. When coupled to the electronics modules 302, 304, first and second surfaces 400, 402 of the probe card 310 are oriented perpendicularly to the generally planar configurations of the electronics modules 302, 304. The wafer 306 is positioned on, and is electrically coupled to, the first surface 400 of the probe card 310. In this manner, the probe card 310 serves to electrically couple the DUTs on the wafer 306 to the electronics modules 302, 304 of the tester 308. FIG. 4 illustrates a cross-sectional elevation of the tester 308, probe card 310, wafer 306, one of the tester electronics modules 302, and one of the application specific electronics modules 304 shown in FIG. 3.

Figure 5:
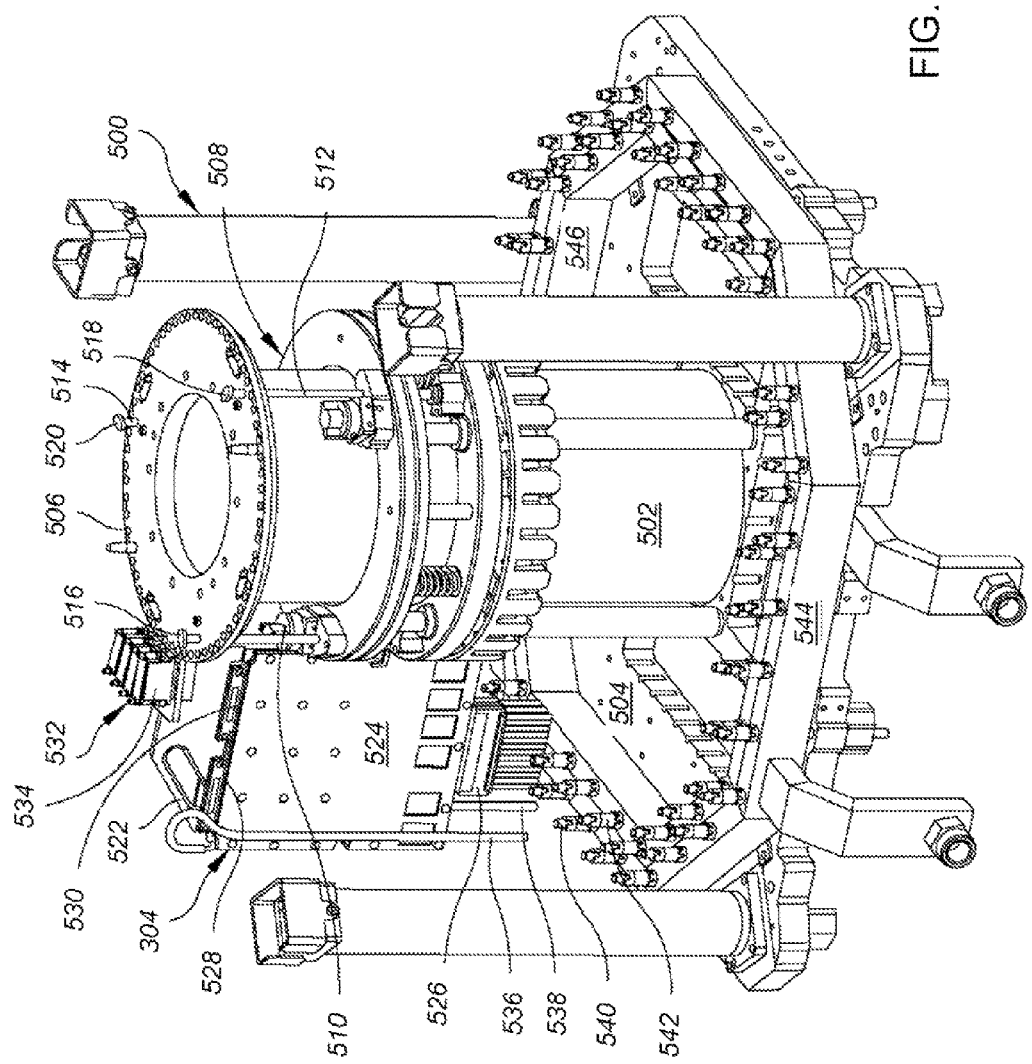
FIG. 5 illustrates an exemplary tester chassis to which the tester electronics modules assemblies and application specific electronics modules shown in FIGS. 3 & 4 may be mounted.

FIG. 5 illustrates an exemplary tester chassis 500 to which at least some of the tester electronics modules 302 and application specific electronics modules 304 of the ATE system 300 may be mounted (though only an application specific electronics module 304 is shown in FIG. 5). Again, and by way of example, the chassis 500 is configured for a wafer sort application. However, one of ordinary skill in the art will understand that the manner in which the electronics modules 302, 304 are mounted to the chassis 500 can be leveraged for use in final test and other applications.

The chassis 500 comprises a cylindrical hub 502 that is coupled between a chassis base 504 and a probe card receiving platform 506. A clamping system 508 surrounds the cylindrical hub 502 and provides a means to clamp probe cards to (or release them from) the probe card receiving platform 506. The clamping system 508 includes a plurality of clamping rods 510, 512, 514 that extend parallel to the cylindrical hub 502 and through the probe card receiving platform 506. Each of the clamping rods 510, 512, 514 is movable in an axial direction, and is capable of 1) moving toward the chassis base 504 to clamp a probe card to the probe card receiving platform 506, and 2) moving away from the chassis base 504 to release a probe card from the probe card receiving platform 506. Each clamping rod 510, 512, 514 is also capable of rotating about its axis, to align (or alternately lock) a T-shaped end 516, 518, 520 of the clamping rod 510, 512, 514 with a corresponding hole in a probe card. The probe card receiving platform 506 and clamping rods 510, 512, 514 are examples of tester-to-DUT interface mounts.

FIG. 5 also illustrates an exemplary application specific electronics module 304 as it is being installed on the chassis 500. By way of example, and in accord with the arrangement of components disclosed in FIGS. 3 & 4, the application specific electronics module 304 is mounted to the chassis 500 at a right angle to the plane of the probe card receiving platform 506 (and thus, at a right angle to any probe card and wafer that are ultimately positioned on the probe card receiving platform 506).

But for its application-specific circuitry and functionality, an application specific electronics module 304 may be constructed similarly to a tester electronics module 302. In this context, the core of an electronics module such as the application specific electronics module 302 may be a water block 522 that provides cooling for first and second boards 524 mounted on opposite surfaces thereof. Only one of the boards 524 is viewable in FIG. 5, with the other board being positioned on a surface of the water block 522 opposite the surface that is viewable in FIG. 5 (i.e., on the back side of the water block 522). Each board 524 comprises an input/output (I/O) connector 526 that facilitates communication with additional electronics in the test system, and a pair of I/O connectors 528, 530 that facilitate communication with one or more DUTs on a wafer. Each of the I/O connectors 528, 530 couples a board 524 to a corresponding interface 532, which interface 532 may comprise a zero insertion force (ZIF) connector 534.

Each interface 532 (and its ZIF connector 534) is electrically coupled to a set of cables, which set of cables is coupled to a respective one of the I/O connectors 528, 530 via an additional connector (which cables and additional connector are not shown in FIG. 5). The bodies of the ZIF connectors 534 (four of which are shown in FIG. 5) are mounted to the water block 522 adjacent the probe card receiving platform 506. When a probe card is positioned on the probe card receiving platform 506, the ZIF connectors 534 electrically couple the application specific electronics module 304 to the probe card.

The ZIF connectors 534 provide the application specific electronics module 304 with a pair of electronics interfaces that are configured to electrically connect to a probe card (or other tester-to-DUT interface, such as a load board) when a probe card is mounted to the probe card receiving platform 506. One of the electronics interfaces enables the application specific electronics module 304 to be configured for communication with a tester electronics module 302, and the other electronics interface enables the application specific electronics module 304 to be configured for communication with at least one DUT. The electronics interfaces are respectively coupled to the tester electronics module 302 and at least one DUT by coupling the ZIF connectors 534 of both the application specific electronics modules 304 and a tester electronics module 302 to a probe card, which probe card completes ATE and DUT signals paths (as previously described with respect to FIG. 1). In some cases, the electronics interfaces for communicating with the tester electronics module 304 and the at least one DUT may be respectively provided by different ones of the ZIF connectors 534. In other cases, contacts of the different electronic interfaces may be combined on one or more ZIF connector 534.

As further shown in FIG. 5, the water block 522 of the application specific electronics module 304 is coupled to water inlet and outlet pipes 536, 538, which inlet and outlet pipes 536, 538 couple the water block 522 to pipe fittings 540, 542 of respective "cool in" and "hot out" water manifolds 544, 546 on the chassis 500. The pipe fittings 540, 542 not only serve to connect the application specific electronics module to the tester's cooling system, but also serve as electronics module mounts. The probe card receiving platform 506 may also serve as an electronics module mount, with the application specific electronics module 304 and other electronics modules simply seated against the probe card receiving platform 506, or hooked, clipped or screwed to the probe card receiving platform 506.

In the case of a tester electronics module 302 (not shown in FIG. 5), an I/O connector such as the I/O connector 526 may, for example, electrically connect the tester electronics module 302 to electronics of the tester 308 that provide power, control and data signals. However, in the case of an application specific electronics module 304, the I/O connector 526 of the module 304 may connect the module 304 to only some (or some types) of signals provided by the tester 308 (or to none at all). In fact, in some cases, an application specific electronics module 304 may not even be provided with the I/O connector 526, because electrical communication with the tester 308 may be accomplished solely through one or more tester electronics modules 304 and a probe card.

Figure 6:
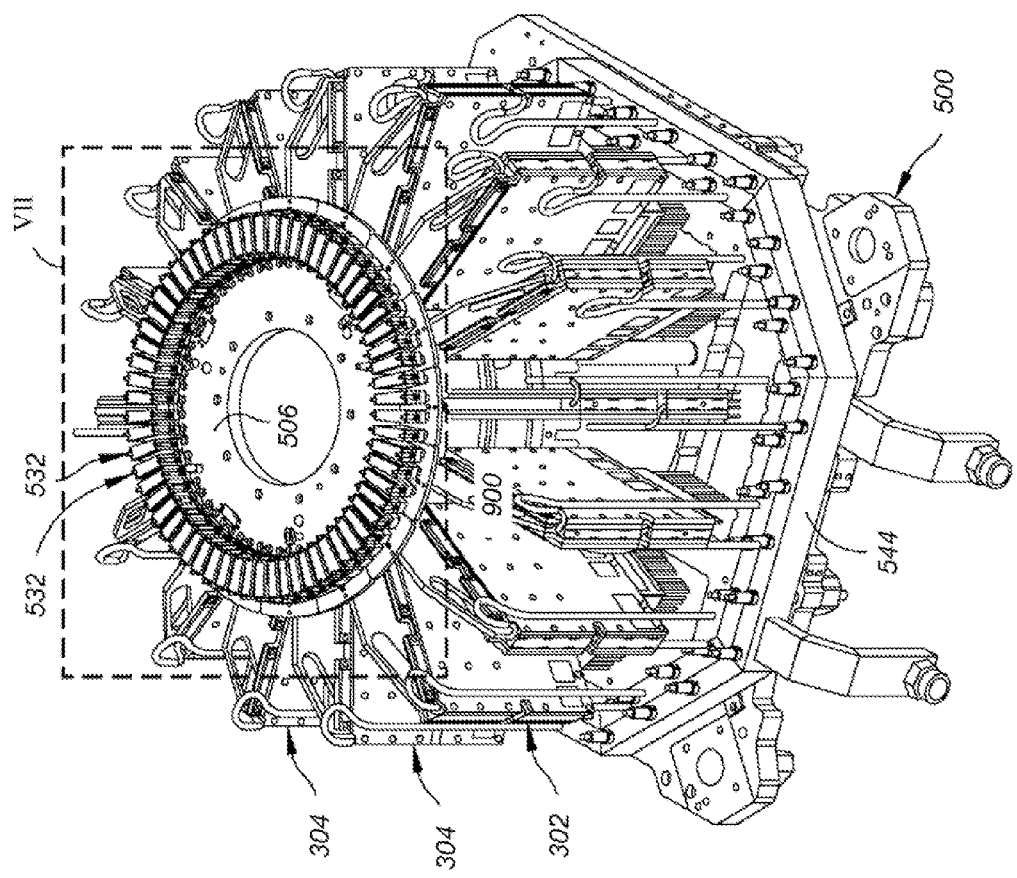
FIG. 6 illustrates the chassis shown in FIG. 5 after installation of a plurality of application specific electronics modules and tester electronics modules.

FIG. 6 illustrates the chassis 500 shown in FIG. 5 after two of the application specific electronics modules 304 and fourteen of the tester electronics modules 302 have been installed on the chassis 500. Typically, an ATE system will be provided with a greater number of tester electronics modules 302 than application specific electronics modules 304. However, the number of each type of module may vary in different test systems, and a greater number of one or the other type of module may be provided in a particular test system (or the same number of each type of module may be provided). By way of example, all of the electronics modules 302, 304 have a similar structural configuration and are mounted to the chassis 500 in the same way.

Figure 7:
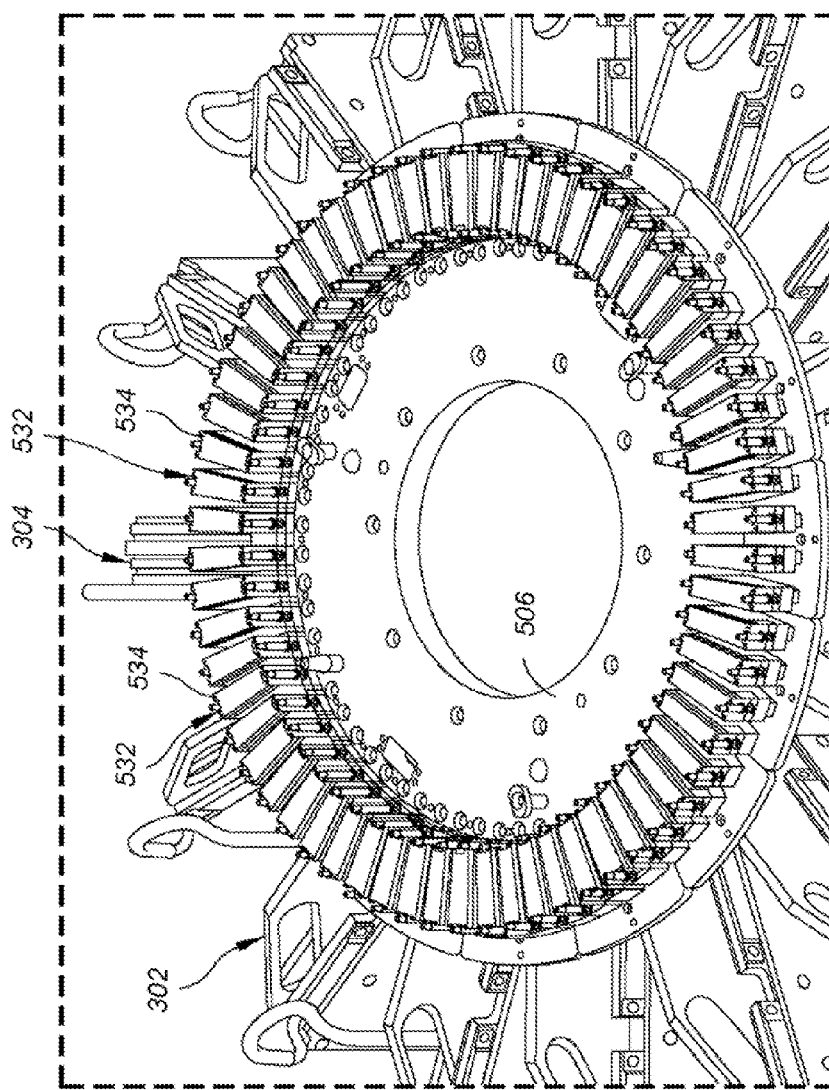
FIG. 7 provides an exploded view of the probe card receiving platform and ring of DUT interfaces shown in FIG. 6.

Note that the DUT interfaces 532 and ZIF connectors of each electronics module 302, 304 are positioned adjacent the DUT interfaces 532 (and ZIF connectors) of adjacent electronics modules 302, 304, thereby forming a ring of DUT interfaces 532 (and ZIF connectors) around the probe card receiving platform 506. FIG. 7 provides an exploded view of the probe card receiving platform 506 and ring of DUT interfaces 532 shown in FIG. 6 (including the ZIF connectors 336 of the DUT interfaces 334).

Figure 8:
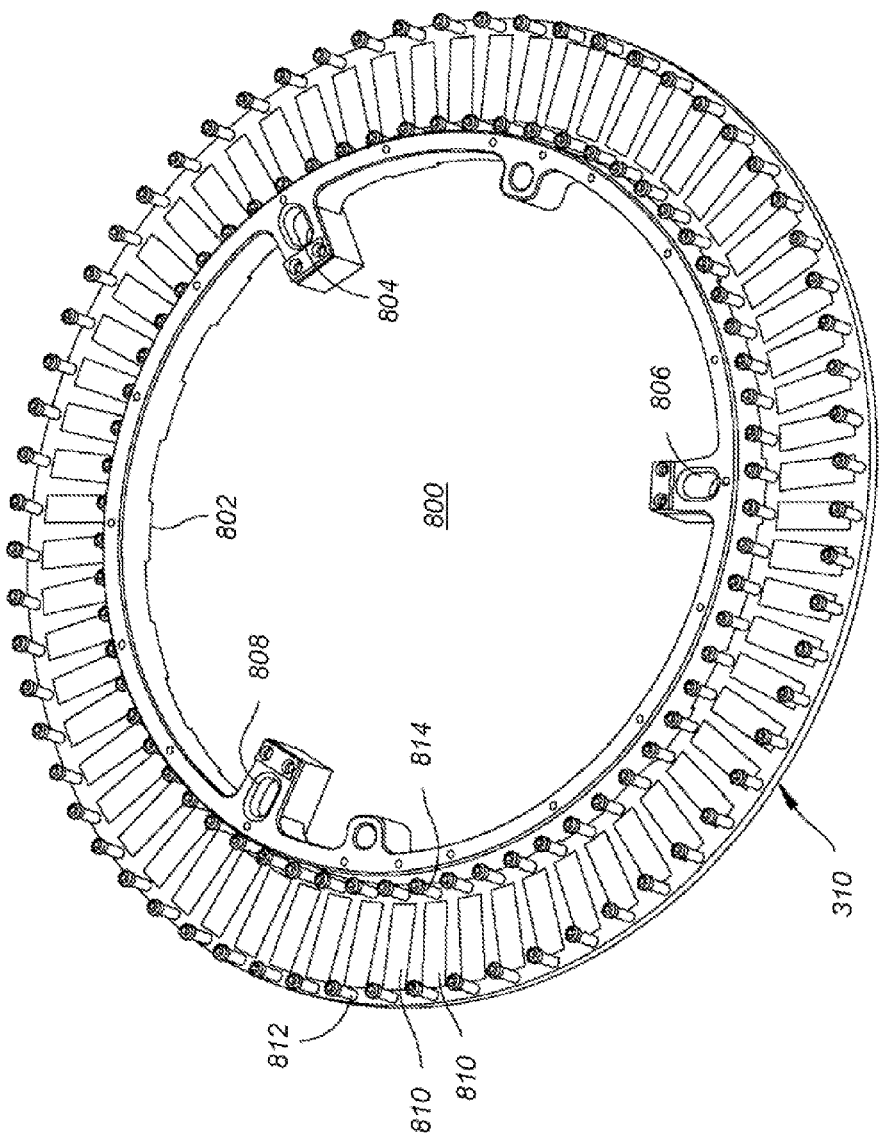
FIG. 8 illustrates an exemplary probe card and, in particular, the surface of the probe card that mates with the DUT interfaces shown in FIGS. 6 & 7.

FIG. 8 illustrates an exemplary probe card 310, and in particular, the surface 800 of the probe card 310 that mates with the DUT interfaces 532 (and their ZIF connectors 534) shown in FIGS. 6 & 7. Attached to the surface 800 of the probe card 310 is a stiffening ring 802. Formed in the stiffening ring 802 are the holes 804, 806, 808 that receive the T-shaped ends 516, 518, 520 of the clamping rods 510, 512, 514 shown in FIG. 5. Patterned on the surface 800 of the probe card 310 are arrays of electrical contacts 810 to which similarly-oriented arrays of electrical contacts provided by the ZIF connectors 534 electrically couple. Note that, in FIG. 8, each array of electrical contacts 810 is shown as a single rectangle representing the many electrical contacts of the array 810. In reality, each rectangle may comprise hundreds of individual electrical contacts. For example, in some embodiments, each array of electrical contacts 810 may comprise 418 contacts with an approximate 1 mm×1 mm pitch (though more or less contacts could be provided, with a pitch that is larger or smaller than 1 mm×1 mm). When the probe card 310 is coupled to the ZIF connectors 534 of both tester and application specific electronics modules 302, 304, the probe card 310 couples electronic interfaces of particular tester and application specific electronics modules 302, 304. The probe card 310 also couples the electronics interfaces of particular tester or application specific electronics modules 302, 304 to one or more DUTs.

Positioned at opposite ends of each array of electrical contacts 810 are first and second latching pins 812, 814, each of which may, in one embodiment, have a generally mushroom-like shape. Each ZIF connector 534 may comprise a ZIF connector-to-DUT clamping mechanism that engages a corresponding pair of the latching pins 812, 814. When the clamping mechanism is placed in its clamping mode, the clamping mechanism 1) exerts a first set of orthogonal forces to the probe card 310 by pulling the latching pins 812, 814 away from the surface 800 of the probe card 310, and 2) applies a second orthogonal force to the probe card 310 by pressing a DUT interface 532 (including its ZIF connector 534) against the probe card 310. Further details of an exemplary ZIF connector-to-DUT clamping mechanism are disclosed in U.S. patent application Ser. No. 12/626,506, filed Nov. 25, 2009, and entitled "Test Electronics to Device Under Test Interfaces, and Methods and Apparatus Using Same", which application is hereby incorporated by reference for all that it discloses.

When fully clamped, the orthogonal force applied to the probe card 310 by a DUT interface 532 is equal to (or at least substantially equal to) the set of orthogonal forces applied to the probe card 310 by its ZIF connector-to-DUT clamping mechanism pulling the latching pins 812, 814 away from the surface 602 of the probe card 310. Thus, the clamping of each ZIF connector 534 to the probe card 310 exerts a net zero force (or close to net zero force) on the probe card 310. As a result, deflection of the surface 800 of the probe card 310 is minimized. Another advantage of the ZIF connector-to-DUT clamping mechanism is that it does not require any DUT connectors to be installed on the probe card 310.

Figure 9:
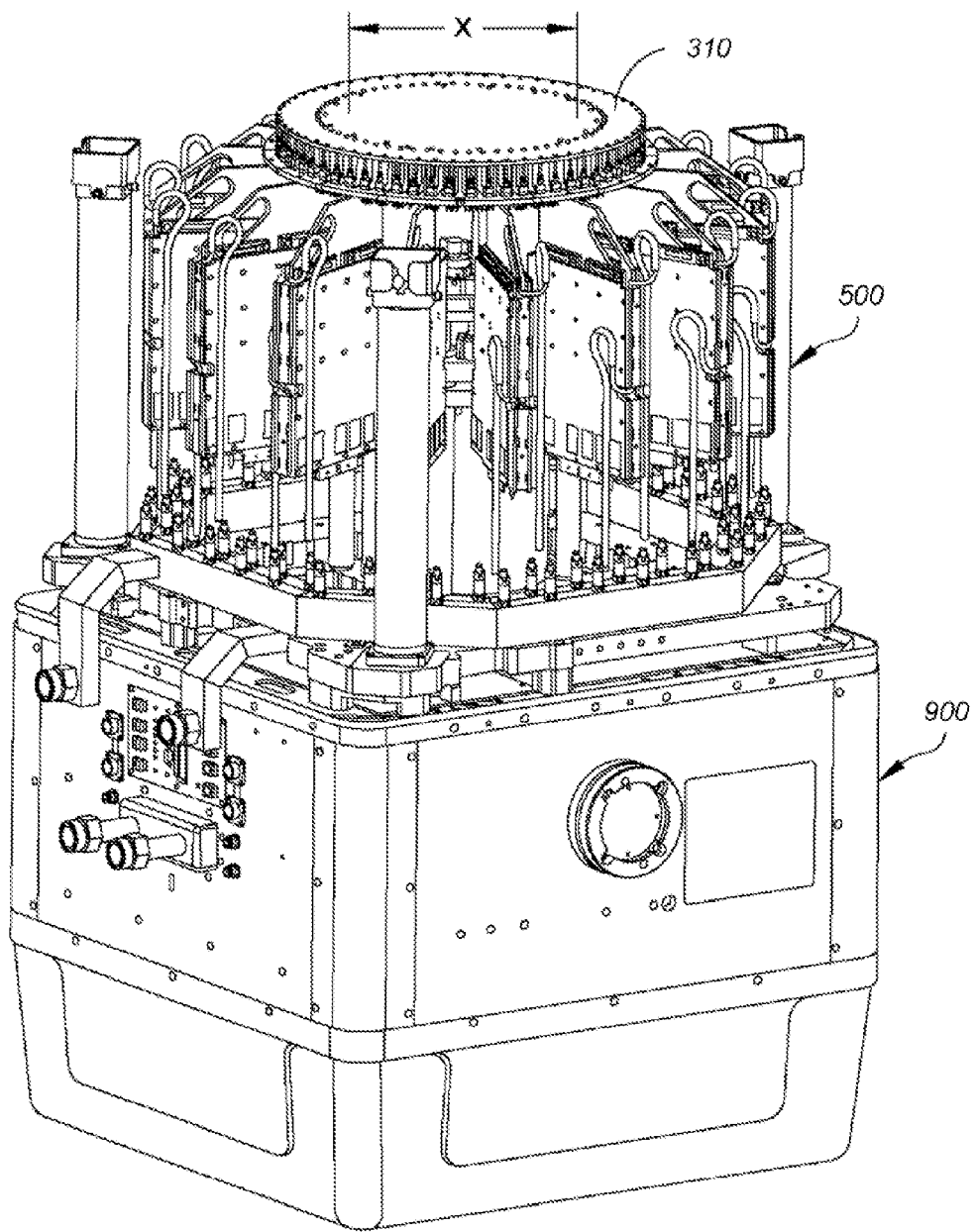
FIG. 9 illustrates the probe card shown in FIG. 8 after it has been positioned on the probe card receiving platform shown in FIGS. 5-7.

FIG. 9 illustrates the probe card 310 after it has been positioned on the probe card receiving platform 506. Typically, a wafer is positioned in the area of the probe card 310 denoted by the diameter "X". FIG. 9 also illustrates how the chassis 500 may be coupled to a test head 900 of a tester.

Figure 10:
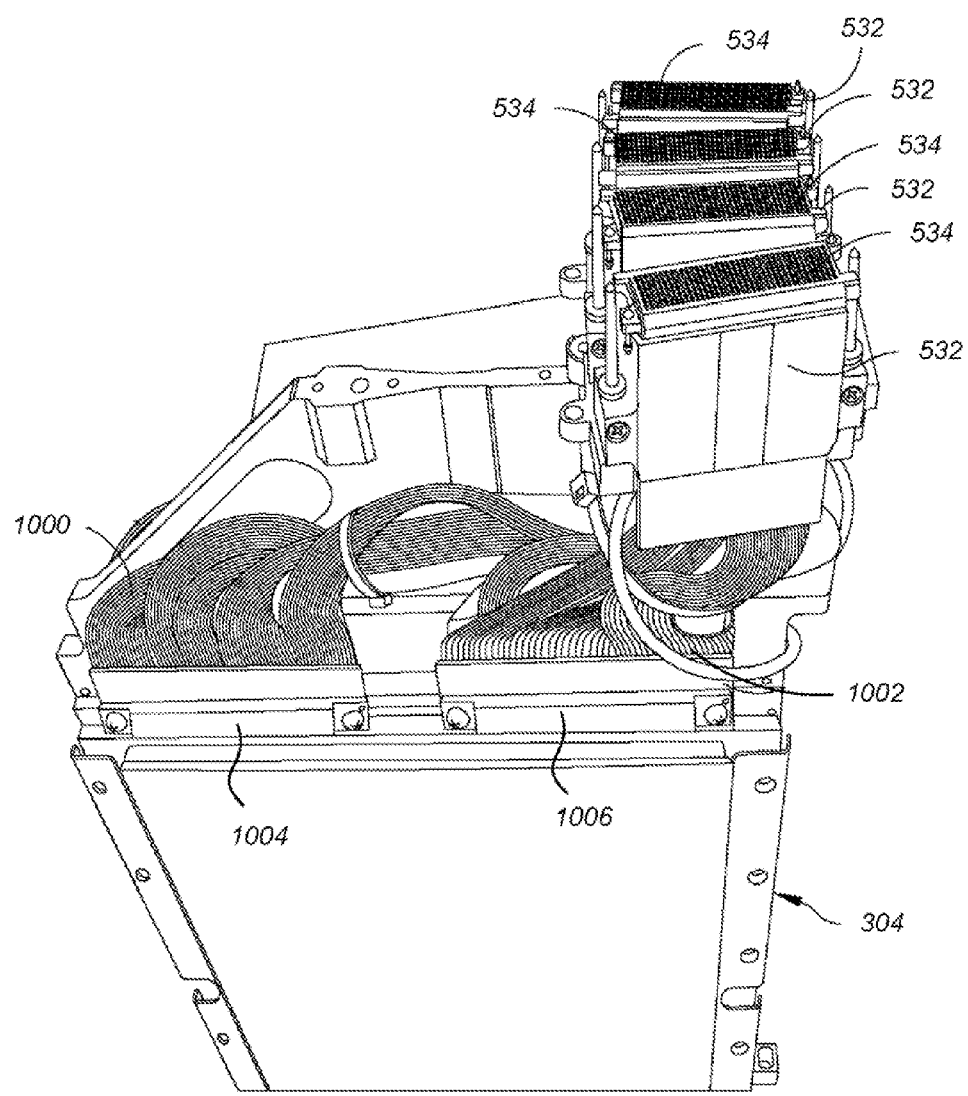
FIG. 10 illustrates an exploded view of the application specific electronics module shown in FIG. 5, and shows exemplary ones of the cables and additional connectors that couple the ZIF connectors of the application specific electronics module to the I/O connectors of the application specific electronics module.

FIG. 10 illustrates an exploded view of the application specific electronics module 304 shown in FIG. 5 and shows exemplary ones of the cables 1000, 1002 and additional connectors 1004, 1006 that couple the ZIF connectors 534 to the I/O connectors 528, 530 (which connectors 528, 530 are covered by connectors 1004 and 1006 in FIG. 10).

What is claimed is:

1. An automated test equipment (ATE) system, comprising:
    a tester having
        i) a plurality of electronics module mounts;
        ii) a tester electronics module mounted to one of the electronics module mounts; and
        iii) an application specific electronics module mounted to one of the electronics module mounts;
    a detachable tester-to-device under test (DUT) interface, electrically and detachably connectable to the tester, the tester-to-DUT interface having a DUT interface, wherein the DUT interface is electrically and detachably connectable to a DUT;
    an ATE signal path between the tester electronics module and the application specific electronics module, the ATE signal path defined in part by the detachable tester-to-DUT interface; and
    a DUT signal path between the application specific electronics module and the DUT interface, the DUT signal path defined in part by the detachable tester-to-DUT interface;
    wherein detachment of the detachable tester-to-DUT interface from the tester breaks both the ATE signal path and the DUT signal path.

2. The ATE system of claim 1, wherein the detachable tester-to-DUT interface is a probe card.

3. The ATE system of claim 1, wherein the detachable tester-to-DUT interface is a load board.

4. The ATE system of claim 1, wherein the tester further comprises a cooling system, in cooling communication with both the tester electronics module and the application specific electronics module.

5. The ATE system of claim 4, wherein the cooling system is a liquid cooling system, and wherein the application specific electronics module comprises a liquid conduit that detachably couples to the liquid cooling system.

6. The ATE system of claim 1, wherein the tester further comprises a power distribution system, in power communication with both the tester electronics module and the application specific electronics module.

7. The ATE system of claim 6, wherein the power distribution system comprises a power distribution circuit, and wherein the power distribution circuit is coupled to the application specific electronics module independently of the detachable tester-to-DUT interface.

8. The ATE system of claim 1, further comprising a DUT electrically connected to the DUT interface.

9. The ATE system of claim 1, wherein the DUT interface is electrically and detachably connectable to a plurality of DUTs, and wherein the plurality of DUTs comprises semiconductor die on a semiconductor wafer.

10. The ATE system of claim 1, wherein the DUT interface is electrically and detachably connectable to a plurality of DUTs, and wherein the plurality of DUTs comprises a plurality of individual electronic devices.

11. The ATE system of claim 1, further comprising at least one additional tester electronics module, wherein each of the at least one additional tester electronics module is mounted to a respective one of the electronics module mounts.

12. The ATE system of claim 11, further comprising at least one additional application specific electronics module, wherein each of the at least one additional application specific electronics module is mounted to a respective one of the electronics module mounts, and wherein the ATE system comprises a greater number of tester electronics modules than application specific electronics modules.

13. The ATE system of claim 1, wherein the electronics module mount to which the tester electronics module is mounted is identical to the electronics module mount to which the application specific electronics module is mounted.

14. The ATE system of claim 1, the tester also having a tester-to-DUT interface mount;
    wherein the tester electronics module has a first electronics interface configured to electrically connect to the tester-to-DUT interface when the tester-to-DUT interface is coupled to the tester-to-DUT interface mount;
    wherein the application specific electronics module has a second electronics interface and a third electronics interface, the second and third electronics interfaces configured to electrically connect to the tester-to-DUT interface when the tester-to-DUT interface is coupled to the tester-to-DUT interface mount, the application specific electronics module configured to communicate with the tester electronics module via the second electronics interface, and the application specific electronics module configured to communicate with the DUT via the third electronics interface.

15. The ATE system of claim 1, further comprising a test controller coupled to the tester.

16. The ATE system of claim 1, the tester also comprising a test controller.

17. The ATE system of claim 1, wherein the tester-to-DUT interface further comprises a first tester interface configured to mate with the tester electronics module and a second tester interface configured to mate with the application specific electronics module.

18. The ATE system of claim 17, wherein the tester-to-DUT interface comprises a printed circuit board having the first and second tester interfaces on a surface and the DUT interface on an opposing surface.

* * * * *